(12) United States Patent
Wang et al.

(10) Patent No.: US 11,214,860 B2
(45) Date of Patent: Jan. 4, 2022

(54) CARBON FIBER FILM AND METHOD FOR MAKING THE SAME

(71) Applicants: Tsinghua University, Beijing (CN); HON HAI PRECISION INDUSTRY CO., LTD., New Taipei (TW)

(72) Inventors: Jiang-Tao Wang, Beijing (CN); Wei Zhao, Beijing (CN); Peng Liu, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 611 days.

(21) Appl. No.: 15/598,278

(22) Filed: May 17, 2017

(65) Prior Publication Data
US 2017/0335446 A1    Nov. 23, 2017

(30) Foreign Application Priority Data
May 20, 2016 (CN) .......................... 201610336942.6

(51) Int. Cl.
| | | |
|---|---|---|
| *B32B 9/00* | (2006.01) | |
| *C23C 14/06* | (2006.01) | |
| *C23C 16/46* | (2006.01) | |
| *C23C 16/44* | (2006.01) | |
| *C23C 16/26* | (2006.01) | |
| *C01B 32/168* | (2017.01) | |

(Continued)

(52) U.S. Cl.
CPC ........ *C23C 14/0605* (2013.01); *C01B 32/168* (2017.08); *C23C 14/50* (2013.01); *C23C 16/26* (2013.01); *C23C 16/4404* (2013.01); *C23C 16/4418* (2013.01); *C23C 16/46* (2013.01); *B82Y 30/00* (2013.01); *Y10T 428/30* (2015.01)

(58) Field of Classification Search
CPC ........ Y10T 428/30; B82Y 30/00; B32B 9/007
USPC .......................................... 428/408; 423/448
See application file for complete search history.

(56) References Cited

U.S. PATENT DOCUMENTS

| 10,011,488 B2 | 7/2018 | Jiang et al. |
|---|---|---|
| 2002/0123230 A1 | 9/2002 | Hubacek |

(Continued)

FOREIGN PATENT DOCUMENTS

| CN | 101279372 | 10/2008 |
|---|---|---|
| CN | 101352669 | 1/2009 |

(Continued)

OTHER PUBLICATIONS

Ke Chang et al., Imaging of Ferroelectric Domains by Charged Nano particle Decoration Method, Journal of Synthetic Crystals, Oct. 31, 2006, 958-962, vol. 35, No. 5.

(Continued)

*Primary Examiner* — Daniel H Miller
(74) *Attorney, Agent, or Firm* — ScienBiziP, P.C.

(57) ABSTRACT

A method for making a carbon fiber film includes suspending a carbon nanotube film in a chamber. A negative voltage is applied to the carbon nanotube film. A carbon source gas is supplied into the chamber, wherein the carbon source gas is cracked to form carbon free radicals, and the carbon free radicals are graphitized to form a graphite layer on the carbon nanotube film.

19 Claims, 13 Drawing Sheets

(51) Int. Cl.
*C23C 14/50* (2006.01)
*B82Y 30/00* (2011.01)

(56) References Cited

U.S. PATENT DOCUMENTS

| | | | |
|---|---|---|---|
| 2006/0198949 A1* | 9/2006 | Phillips | B82Y 30/00 427/122 |
| 2007/0059370 A1 | 3/2007 | Chou et al. | |
| 2007/0281086 A1 | 12/2007 | Hsiao | |
| 2008/0187648 A1* | 8/2008 | Hart | B82Y 30/00 427/8 |
| 2014/0127488 A1* | 5/2014 | Zhamu | H01B 1/04 428/216 |
| 2014/0186256 A1* | 7/2014 | Wu | C23C 14/0605 423/447.3 |
| 2015/0211980 A1 | 7/2015 | Wang et al. | |
| 2015/0221408 A1* | 8/2015 | Gong | C23C 16/0272 428/457 |
| 2015/0240351 A1* | 8/2015 | Chen | C23C 16/26 428/408 |
| 2016/0023903 A1 | 1/2016 | Jiang et al. | |
| 2016/0023908 A1 | 1/2016 | Jiang et al. | |

FOREIGN PATENT DOCUMENTS

| | | |
|---|---|---|
| CN | 102329527 | 1/2012 |
| CN | 102936010 A | 2/2013 |
| CN | 104692357 | 6/2015 |
| CN | 104808325 | 7/2015 |
| CN | 105439114 | 3/2016 |
| TW | 200711722 | 4/2007 |
| TW | I372188 | 9/2012 |
| TW | I386511 | 2/2013 |
| TW | 201604129 | 2/2016 |
| TW | 201604130 A | 2/2016 |

OTHER PUBLICATIONS

Plasma-induced alignment of carbon nanotubes; Bower et al.; Applied Physics Letters; vol. 77, No. 9; p. 830-832; Aug. 7, 2000.

Spatially Selective Guided Growth of High-Coverage Arrays and Random Networks of Single-Walled Carbon Nanotubes and their Integration into Electronic Devices; Kocabas et al.; J. Am. Chem. Soc. 2006, 128, 4540-4541; Mar. 22, 2006.

Fabrication of Ultralong and Electrically Uniform Single-Walled Carbon Nanotubes on Clean Substrates; Wang et al.; Nano Letters 2009, vol. 9, No. 9; 3137-3141; Aug. 3, 2009.

* cited by examiner suspending the carbon nanotube film 160 in the chamber 100

↓ applying the negative voltage to the carbon nanotube film 160

↓ supplying the carbon source gas into the chamber 100, wherein the carbon source gas is cracked to form carbons, and the carbons are graphitized to epitaxially form the graphite layer 52 on each carbon nanotube 56 of the carbon nanotube film 160

FIG. 12

CARBON FIBER FILM AND METHOD FOR MAKING THE SAME

CROSS-REFERENCE TO RELATED APPLICATIONS

This application claims all benefits accruing under 35 U.S.C. § 119 from China Patent Application No. 201610336943.0, filed on May 20, 2016, in the China Intellectual Property Office. This application is related to commonly-assigned application entitled, "METHOD FOR MAKING CARBON FIBER FILM", concurrently filed; "DEVICE FOR MAKING CARBON FIBER FILM", concurrently filed. Disclosures of the above-identified applications are incorporated herein by reference.

FIELD

The present application relates to a method for making carbon fiber film, and particularly to a method for making a vapor grown carbon fiber film.

BACKGROUND

Vapor grown carbon fibers (VGCFs) have a high specific strength, a specific modulus, and a crystalline orientation. In addition, VGCFs have good electrical conductivity and thermal conductivity. Thus, VGCFs have attracted much attention in recent years.

VGCFs is conventionally prepared by catalytic cracking a hydrocarbon compound and vapor depositing on transition metal, such as iron, cobalt, nickel, or any combination alloy thereof. In detail, a substrate is located in a reaction tube, wherein the substrate is coated a metal granule layer acted catalyst, and then a mixing gas including a hydrocarbon and a hydrogen is supplied into the reaction tube. Finally, VGCFs are grown on the substrate. However, the above-described method for making VGCFs is difficult to have high production efficiency.

What is needed, therefore, is to provide a method for making carbon fiber film that can overcome the above-described shortcomings.

BRIEF DESCRIPTION OF THE DRAWINGS

Implementations of the present technology will now be described, by way of example only, with reference to the attached figures, wherein:

FIG. 12 is a schematic process flow of one embodiment of a method for making the carbon nanotube film of FIG. 1.

DETAILED DESCRIPTION

Figure 1:
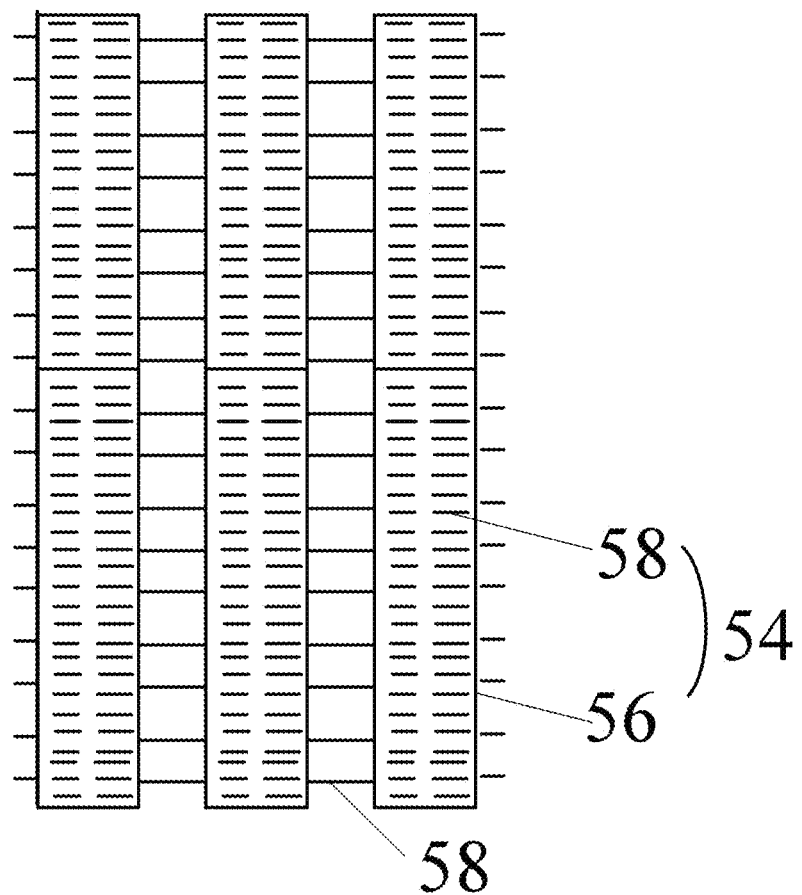
FIG. 1 is a schematic view of a carbon fiber film.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
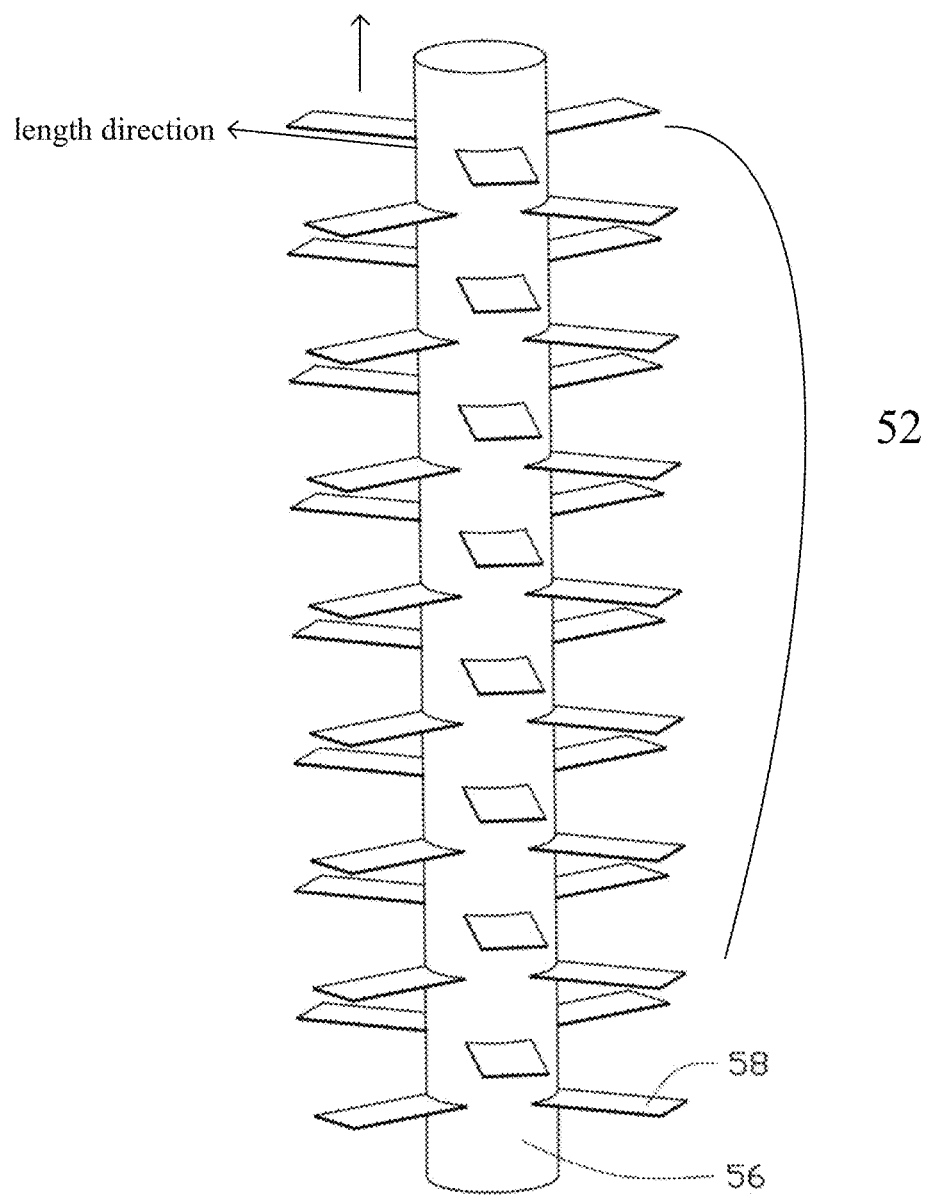
FIG. 2 is a three-dimensional schematic view of one carbon fiber of the carbon fiber film.
Figure 3:
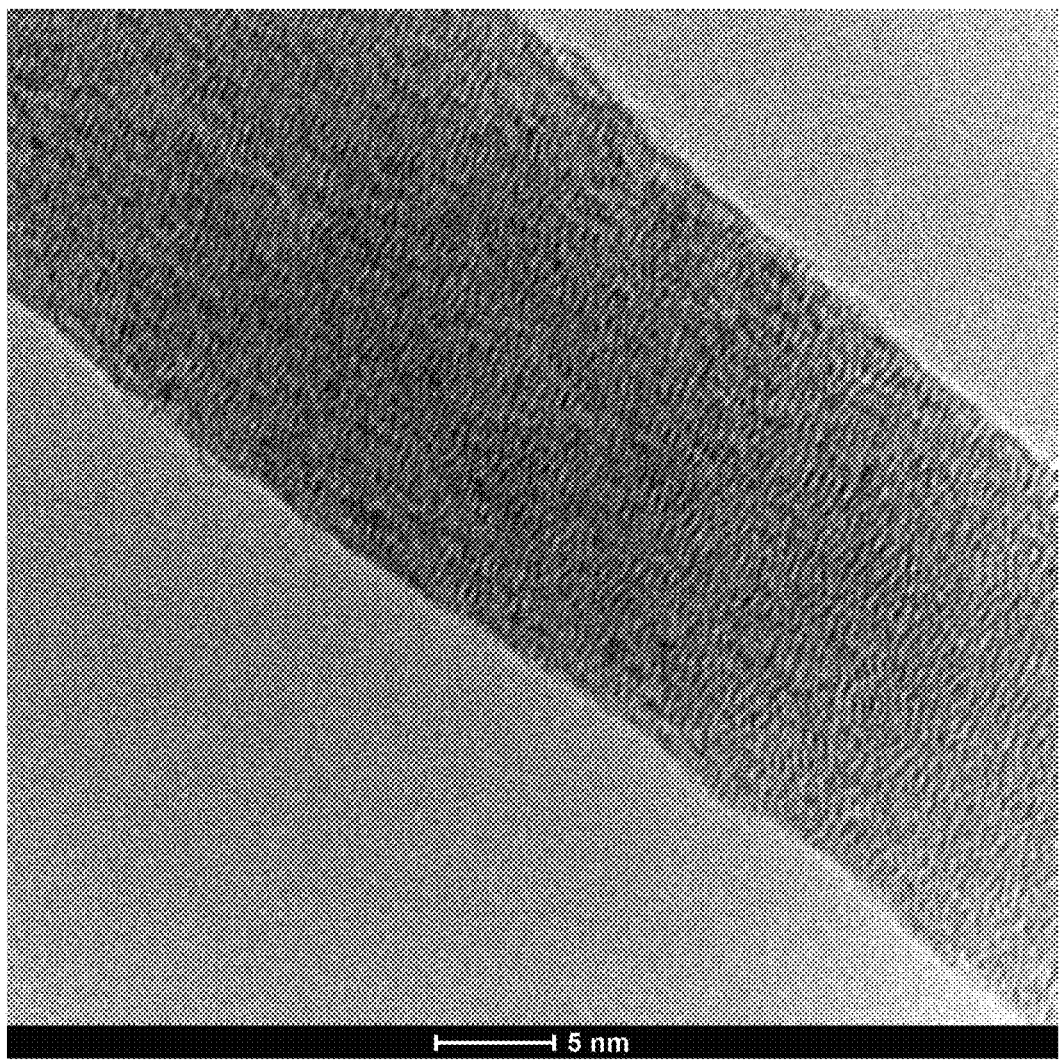
FIG. 3 is a transmission electron microscope (TEM) image of the carbon fiber of FIG. 2.

Referring to FIGS. 1-3, the carbon fiber film 50 is a membrane structure. The carbon fiber film 50 includes a plurality of carbon nanotubes 56 and a plurality of graphite layers 52. The plurality of carbon nanotubes 56 are joined end to end by van der Waals attractive force and extend along a same direction. Each of the plurality of carbon nanotubes 56 is surrounded by the graphite layer 52. The graphite layer 52 includes a plurality of graphite sheets 58 spaced from each other. Part of the edge of each graphite sheet 58 is joined with the carbon nanotube 56 by a van der waals bond. An angle defined is between each graphite sheet 58 and an outside wall of the carbon nanotube 56, and the angle is about 90 degrees. In one embodiment, the length direction of each graphite sheet 58 is perpendicular to the axial direction of each carbon nanotube 56. An angle is defined between the thickness direction of each graphite sheet 58 and the axial direction of each carbon nanotube 56, the angle is greater than or equal to 0 degrees, and less than or equal to 90 degrees. In one embodiment, the thickness direction of each graphite sheet 58 is parallel to the axial direction of each carbon nanotube 56. The plurality of graphite sheets 58 are interval distribution on the outside wall of each carbon nanotube 56. The plurality of graphite sheets 58 has a length and a width of about several tens of nanometers. In one embodiment, the length and the width of the plurality of graphite sheets 58 is greater than 0 nanometers and less than or equal to 10 nanometers.

The carbon fiber film 50 includes a plurality of carbon fibers 54 joined end to end. The plurality of carbon fibers 54 extends along a same direction. Each carbon fiber 54 includes one carbon nanotube 56 and the plurality of graphite sheets 58. The plurality of graphite sheets 58 forms the graphite layer 52. In each carbon fiber 54, each graphite sheet 58 is joined with the carbon nanotube 56 by a van der waals bond, and the length direction of each graphite sheet 58 is perpendicular to the axial direction of each carbon nanotube 56. Two adjacent carbon fibers 54 are joined by van der Waals force. In the carbon fiber film 50, two adjacent carbon fibers 54 side by side may be spaced apart from each other. Pores are defined in the carbon fiber film 50 by adjacent carbon fibers 54.

The plurality of carbon nanotubes 56 is uniformly distributed and substantially parallel to a surface of the carbon fiber film 50. The carbon fiber film 50 is a free-standing film and can bend to desired shapes without breaking.

A diameter of each carbon fiber 54 is related to the thickness of the graphite layer 52. The diameter of the plurality of carbon fibers 54 can be in a range from about 450 nanometers to about 100 microns. In one embodiment, the diameter of the plurality of carbon fibers 54 is about 500 nanometers.

The carbon fiber film 50 can include at least two stacked carbon nanotube films 20, adjacent carbon nanotube films 20 can be combined by only the van der Waals attractive force therebetween. Additionally, an angle between the extending directions of the carbon nanotubes in two adjacent carbon nanotube films 20 can be in a range from about 0 degrees to about 90 degrees. Stacking the carbon nanotube films 20 will improve the mechanical strength of the carbon fiber film 50. In one embodiment, the carbon fiber film 50 includes two layers of the carbon nanotube films 20, and the angle between the extending directions of the carbon nanotubes in two adjacent carbon nanotube films 20 is about 90 degrees.

The carbon fiber film 50 has good electrical conductivity. A sheet resistance of the carbon fiber film 50 is less than or equal to 100 ohm. Each of the plurality of carbon nanotubes 56 is surrounded by the graphite layer 52, and the length direction of each graphite sheet 58 is perpendicular to the axial direction of each carbon nanotube 56. Therefore, the carbon fiber film 50 has a large specific surface area and has good properties when used as an electrode material.

Figure 4:
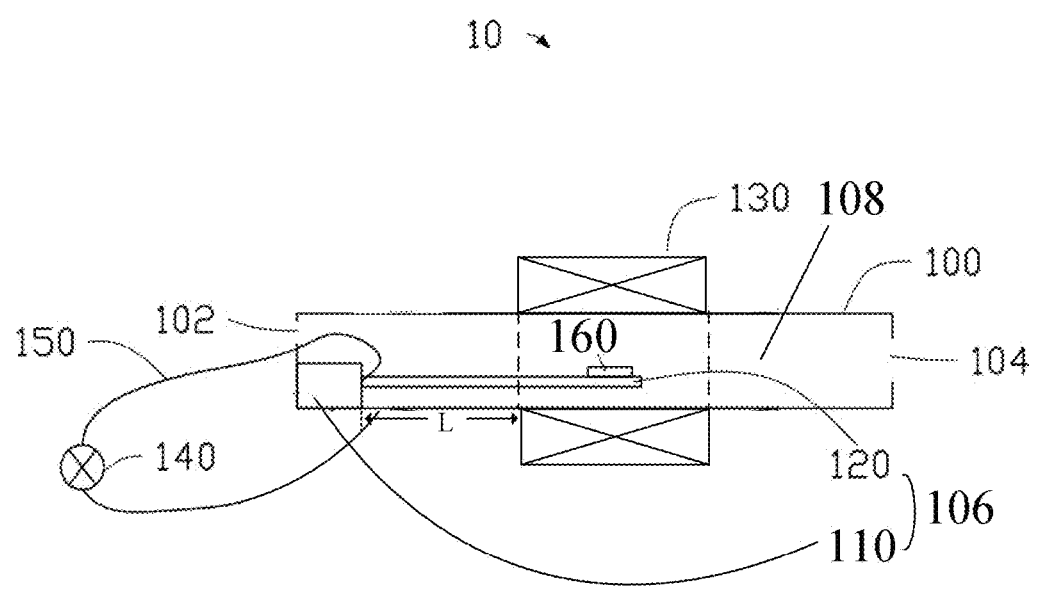
FIG. 4 is a schematic view of one embodiment of a device used for making the carbon fiber film of FIG. 1.

Referring to FIG. 4, a device 10 used for making the carbon fiber film 50, includes a chamber 100, a support structure 110, a conductor 120, a heater 130, a power supply 140, and some conductive wires 150. The support structure 110 and the conductor 120 are inside of the chamber 100. The heater 130 is located outside of the chamber 100 and used to heat the chamber 100. The power supply 140 is located outside of the chamber 100, and electrically connected to the support structure 110 or the conductor 120 by the conductive wire 150. The support structure 110 and the conductor 120 form a support base 106. The support base 106 can be used for suspending a carbon nanotube film 160 in the chamber 100 and supplying electric current to the carbon nanotube film 160. The power supply 140 is electrically connected to the support base 106 by the conductive wire 150. The power supply 140 is used to apply a negative voltage to the carbon nanotube film 160.

The material of the chamber 100 can be selected according to need. In one embodiment, the material of the chamber 100 is quartz. The chamber 100 has an inlet 102 and an outlet 104 opposite to the inlet 102.

Figure 5:
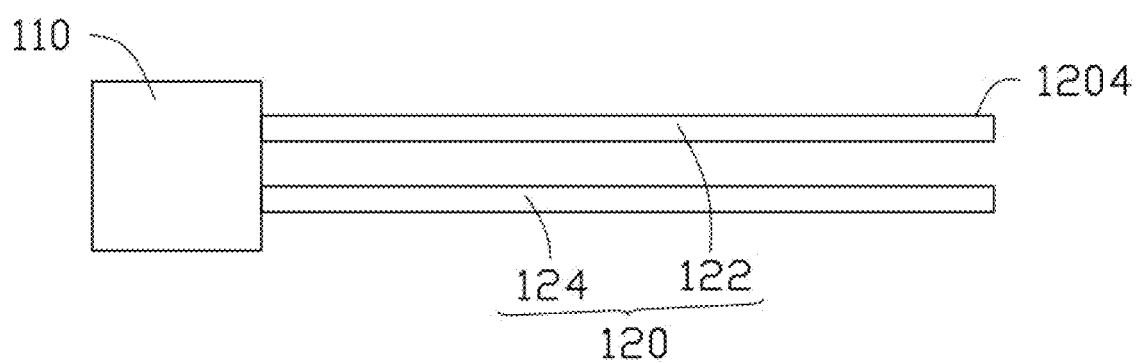
FIG. 5 is a schematic view of a whole structure formed by a support structure and a conductor.
Figure 6:
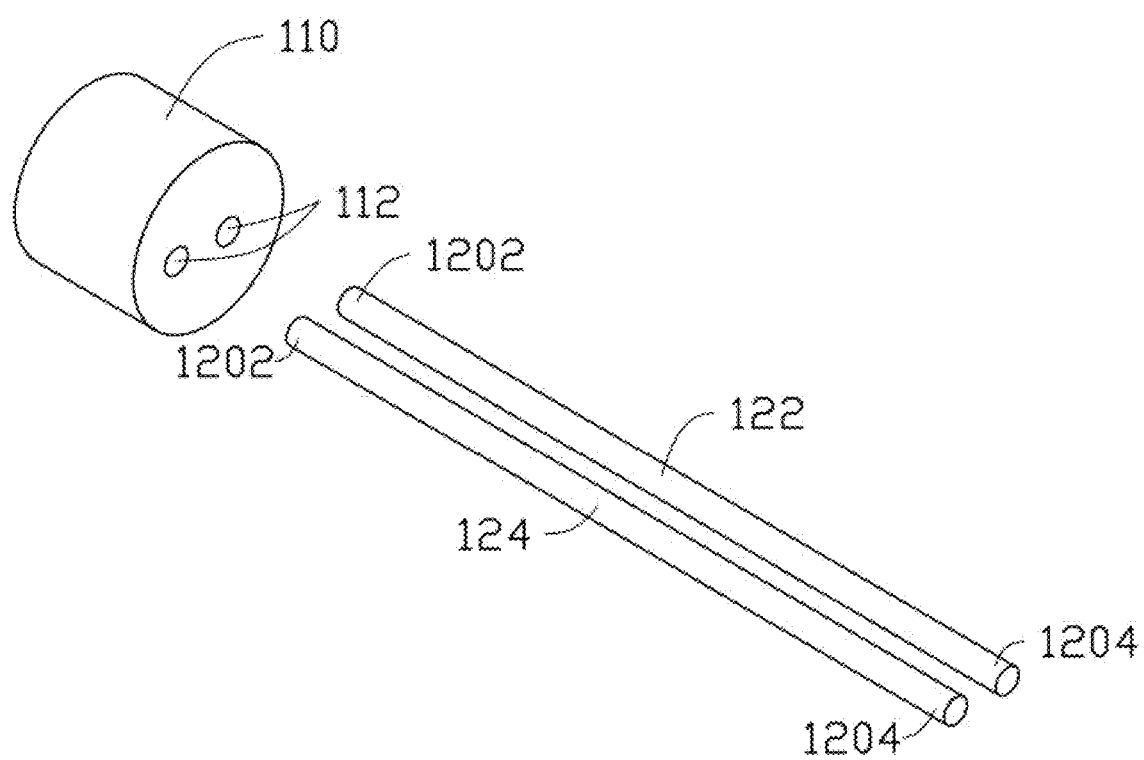
FIG. 6 is a three-dimensional exploded schematic view of the whole structure of FIG. 5.

Referring to FIGS. 5 and 6, the support structure 110 defines a hole 112, and the conductor 120 has a first end 1202 and a second end 1204 opposite to the first end 1202. The first end 1202 is inserted into the hole 112 so that the conductor 120 is suspended in the chamber 100. A portion of the chamber 100 surrounded by the heater 130 is defined as a reaction region 108. A portion of the chamber 100 without surrounded by the heater 130 is defined as a non-reaction region. A carbon source gas is cracked to form carbon free radicals in the reaction region 108.

The support structure 110 can be conductive or not conductive. When the support structure 110 is conductive, the power supply 140 can be directly electrically connected to the conductor 120, or electrically connected to the conductor 120 via the conductive support structure 110. When the support structure 110 is not conductive, the power supply 140 should be directly electrically connected to the conductor 120.

The support structure 110 can only be located in the non-reaction region and cannot be surrounded by the heater 130. The reason is explained in detail below. In the reaction region 108, the carbon source gas is cracked during the preparation of the carbon fiber film 50 to form carbon free radicals. If the support structure 110 is surrounded by the heater 130 and is located in the reaction region 108, the carbon free radicals can be deposited and surround the outer wall of the support structure 110 to form a carbon layer. The carbon free radicals are conductive, thus the carbon layer is also conductive. After applying the negative voltage to the carbon nanotube film 160, the negative charges would be transferred to the inter-wall of the chamber 100 rather than the carbon nanotube film 160, because the support structure 110 is located on and in contact with the lower inter-wall of the chamber 100 by the deposited carbon layer. Thus, the equal electric potential is formed in the walls of the chamber 100, and there are no electric charges in the carbon nanotube film 160, accordingly, no negative voltage is applied to the carbon nanotube film 160. Thus, the support structure 110 cannot be surrounded by the heater 130 and can only be located in the non-reaction region. In one embodiment, the distance between the support structure 110 and the reaction region 108 is defined as L, and L is greater than or equal to 20 centimeters.

In order not to contaminate the growth environment of the carbon fiber film 50 in the chamber 100 and in order to increase the purity of the carbon fiber film 50, the material of the support structure 110 can be carbon material or silicon material. The shape of the support structure 110 is not limited as long as the conductor 120 can be suspended in the chamber 100 by the support structure 110. In one embodiment, the support structure 110 is a cylindrical quartz column, the quartz column has a bottom surface perpendicular to the extending direction of the conductor 120, and the bottom surface defines the hole 112. The quartz is insulated at room temperature.

The conductor 120 can be used to support the carbon nanotube film 160 so that parts of the carbon nanotube film 160 are suspended in the chamber 100. The conductor 120 is also used to electrically connect the carbon nanotube film 160 to the power supply 140. The shape of the conductor 120 is not limited as long as parts of the carbon nanotube film 160 can be suspended in the chamber 100. In one embodiment, the conductor 120 includes a first conductor 122 and a second conductor 124. The first conductor 122 and the second conductor 124 are spaced from each other and parallel to each other. When the chamber 100 is a quartz tube, the extending directions of the first conductor 122 and the second conductor 124 is parallel to the axial of the quartz tube. The support structure 110 defines two holes 112, the first conductor 122 is inserted into one hole 112, and the second conductor 124 is inserted into another hole 112. The conductor 120 is formed of a conductive material, and the material of the conductor 120 can be carbon material, in order to ensure that the impurity is not introduced into the chamber 100 and increase the purity of the carbon fiber film 50. In one embodiment, the conductor 120 is a graphite rod formed by graphite.

The heater 130 can be located outside the chamber 100 and surrounds the chamber 100 so as to heat the chamber 100 to a temperature of about 800 degrees Celsius to about 1100 degrees Celsius. In one embodiment, the heater 130 only surrounds the middle portion of the chamber 100 to define the reaction region 108 and the second end 1204 of the conductor 120 is located in the reaction region 108.

The power supply 140 is electrically connected to the conductor 120 and used to apply the negative voltage to the conductor 120. The negative voltage can be in a range of about −6000 volts (V) to about −600 V. In one embodiment, the negative voltage is in a range from about −3000 V to about −600 V. The method for applying the negative voltage to the conductor 120 or the conductive support structure 110 is not limited. For example, one terminal of power supply 140 is electrically connected to the conductor 120, and another terminal of the power supply 140 is grounded or electrically connected to a metal shell surrounding the chamber 100. Thus, the negative voltage is applied to the conductor 120. The metal shell supports, protects and shields the chamber 100, and shields the outside interference. The material of the metal shell can be nickel, a resistive alloy or the like.

Figure 7:
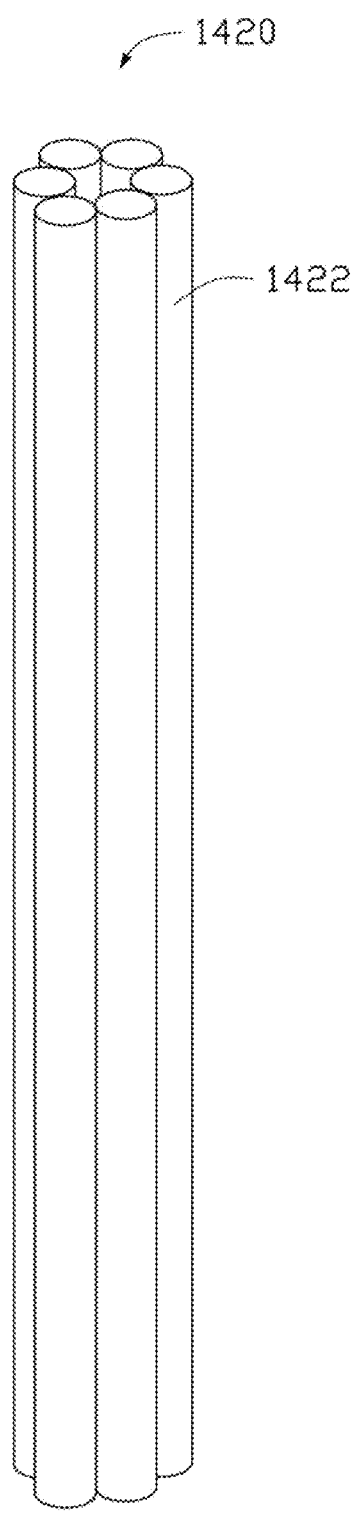
FIG. 7 is a schematic view of one embodiment of a carbon nanotube wire structure.
Figure 8:
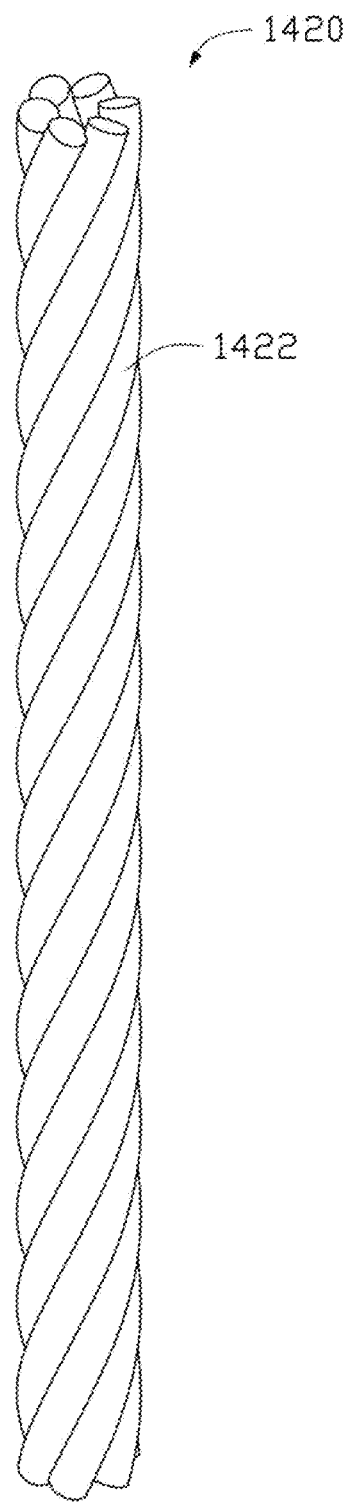
FIG. 8 is a schematic view of another embodiment of the carbon nanotube wire structure.

The conductive wire 150 has a first connecting end and a second connecting end opposite to the first connecting end. The first connecting end of the conductive wire 150 is electrically connected to the power supply 140, and the second connecting end of the conductive wire 150 enters the chamber 100 and is electrically connected to the conductor 120. The conductive wire 150 is made of conductive material. In order not to contaminate the growth environment of the carbon fiber film 50 in the chamber 100 and in order to increase the purity of the carbon fiber film 50, the material of the conductive wire 150 can be carbon material. In one embodiment, the conductive wire 150 is a carbon nanotube 56 or a carbon nanotube wire structure. Referring to FIG. 7, the carbon nanotube wire structure 1420 includes a plurality of carbon nanotube wires 1422 substantially parallel with each other. Referring to FIG. 8, the carbon nanotube wire structure 1420 includes a plurality of carbon nanotube wires 1422 twisted with each other.

Figure 9:
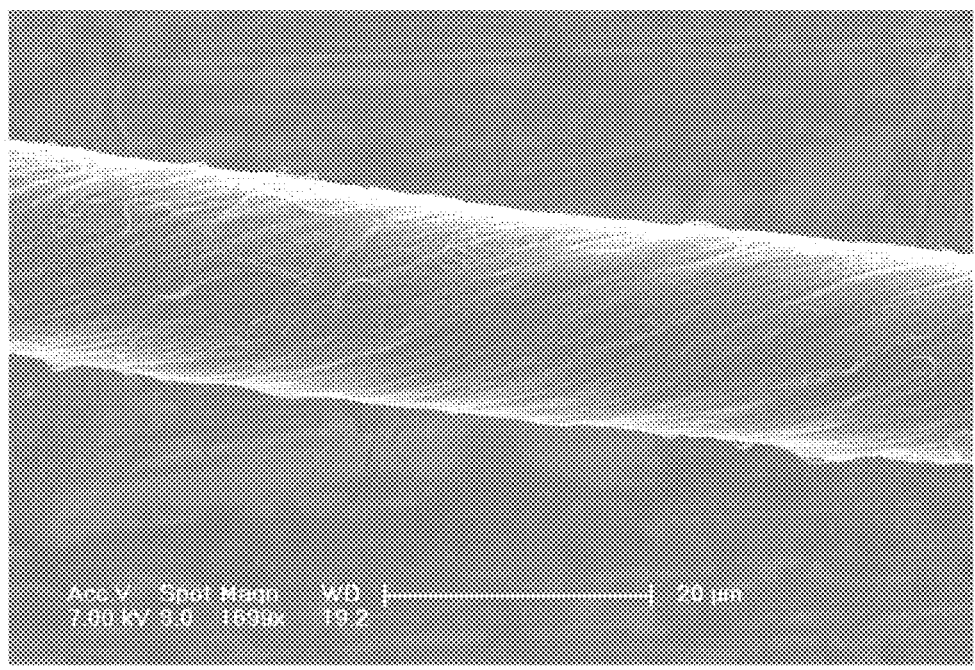
FIG. 9 is a scanning electron microscope (SEM) image of a twisted carbon nanotube wire.
Figure 10:
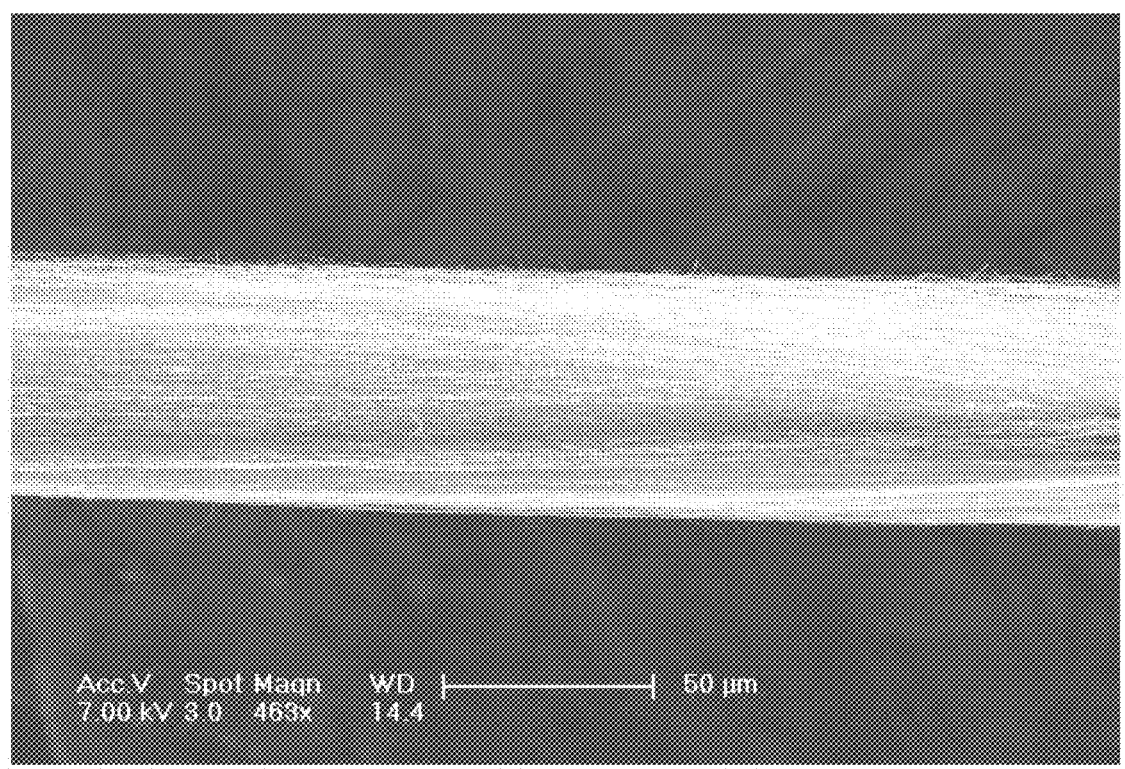
FIG. 10 is an SEM image of an untwisted carbon nanotube wire.

The carbon nanotube wire 1422 can be twisted or untwisted. Referring to FIG. 9, the twisted carbon nanotube wire 1422 includes a plurality of carbon nanotubes 56 helically oriented around an axial direction of the twisted carbon nanotube wire 1422. Referring to FIG. 10, the untwisted carbon nanotube wire 1422 includes a plurality of carbon nanotubes 56 substantially extending along a same direction (i.e., a direction along the length of the untwisted carbon nanotube wire 1422), and the carbon nanotubes 56 are substantially parallel to the axis of the untwisted carbon nanotube wire 1422. More specifically, the untwisted carbon nanotube wire 1422 includes a plurality of successive carbon nanotubes 56 joined end to end by van der Waals attractive force therebetween.

A length of the carbon nanotube wire 1422 can be set as desired. A diameter of the carbon nanotube wire 1422 can be in a range from about 0.5 nanometers to about 100 micrometers. The carbon nanotubes 56 in the carbon nanotube wire 1422 can be single-walled, double-walled, or multi-walled carbon nanotubes.

When the device 10 is in use, the carbon nanotube film 160 is placed on the conductor 120. In one embodiment, the carbon nanotube film 160 is near the second end 1204 and is surrounded by the heater 130. The temperature of the reactive region in the chamber 100 is heated to the temperature from about 800 degrees Celsius to about 1100 degrees Celsius. The power supply 140 is adjusted to apply the negative voltage to the conductor 120. Thus, the negative voltage is also applied to the carbon nanotube film 160. The carbon source gas is supplied into the chamber 100, and the carbon source gas is cracked to form carbon free radicals. Because the carbon nanotube film 160 has the negative voltage, the carbon free radicals are graphitized to epitaxially grow graphite layer 52 on each carbon nanotube 56 of the carbon nanotube film 160. Thus, the carbon fiber film 50 is formed.

Figure 11:
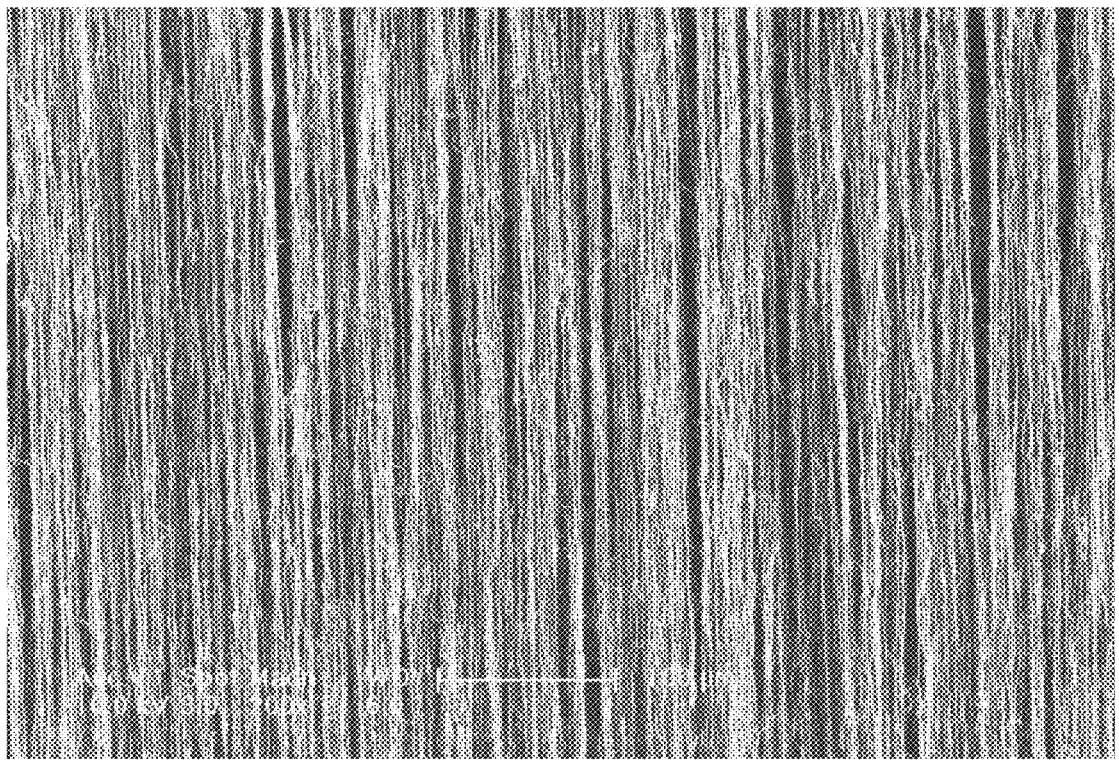
FIG. 11 is an SEM image of a drawn carbon nanotube film.

Referring to FIG. 11, the carbon nanotube film 160 includes a plurality of successive and oriented carbon nanotubes 56 joined end-to-end by van der Waals attractive force therebetween. The carbon nanotubes 56 in the carbon nanotube film 160 extend along the same direction. The carbon nanotubes 56 are parallel to a surface of the carbon nanotube film 160. The plurality of carbon nanotubes 56 may be single-walled, double-walled, multi-walled carbon nanotubes, or their combinations. The carbon nanotubes 56 which are single-walled have a diameter of about 0.5 nanometers (nm) to about 50 nm. The carbon nanotubes 56 which are double-walled have a diameter of about 1.0 nm to about 50 nm. The carbon nanotubes 56 which are multi-walled have a diameter of about 1.5 nm to about 50 nm. The carbon nanotube film 160 can be a pure structure consisted of the carbon nanotubes 56.

The carbon nanotube film 160 is a free-standing film. The term "free-standing" includes, but not limited to, the carbon nanotube film 160 that does not have to be supported by a substrate. For example, the free-standing carbon nanotube film 160 can sustain the weight of itself when it is hoisted by a portion thereof without any significant damage to its structural integrity. So, if the free-standing carbon nanotube film 160 is placed between two separate supporters, a portion of the free-standing carbon nanotube layer structure, not in contact with the two supporters, would be suspended between the two supporters and yet maintain film structural integrity.

It is to be understood that a plurality of carbon nanotube films 160 in a cross-overlapping arrangement or parallel to each other can be placed on the conductor 120 to form a plurality of carbon fiber films 50.

Referring to FIG. 12, a method for making the carbon fiber film 50 includes the steps:

S1, suspending the carbon nanotube film 160 in the chamber 100;

S2, applying the negative voltage to the carbon nanotube film 160; and

S3, supplying the carbon source gas into the chamber 100, wherein the carbon source gas is cracked to form carbon free radicals, and the carbon free radicals are graphitized to epitaxially form the graphite layer 52 on each carbon nanotube 56 of the carbon nanotube film 160.

In the step S1, the chamber 100 has an inlet 102 and an outlet 104 for gas entry and exit. In one embodiment, the chamber 100 is a quartz tube. The quartz tube is surrounded by the metal shell. The metal shell supports, protects and shields the chamber 100, and shields the outside interference. The material of the metal shell can be nickel, the resistive alloy or the like.

The method for suspending the carbon nanotube film 160 in the chamber 100 is not limited. The carbon nanotube film 160 is suspended in the chamber 100 by the support structure 110 and the conductor 120. In one embodiment, referring to FIGS. 4 and 5, the conductor 120 includes the first conductor 122 and the second conductor 124. The first conductor 122 and the second conductor 124 are spaced from each other and parallel to each other. When the chamber 100 is a quartz tube, the extending directions of the first conductor 122 and the second conductor 124 is parallel to the axial of the quartz tube. The support structure 110 defines two holes 112, the first conductor 122 is inserted into one hole 112, and the second conductor 124 is inserted into another hole 112. The first conductor 122 and the second conductor 124 can be parallel to each other and in contact with each other.

In order to ensure that the impurity is not introduced into the chamber 100 and increase the purity of the carbon fiber film 50, the support structure 110, the first conductor 122, and the second conductor 124 are formed by conductive carbon material or silicon material. In one embodiment, the first conductor 122 and the second conductor 124 are graphite rods formed by graphite. The support structure 110 is a cylindrical structure formed of quartz. The bottom surface of the cylindrical structure is perpendicular to the axial direction of the tubular chamber 100. The bottom surface of the cylindrical structure away from the inlet 102 defines the holes 112. The first conductor 122 and the second conductor 124 can be used for suspending the carbon nanotube film 160 in the chamber 100 and being electrically connected to the carbon nanotube film 160.

The negative voltage can be in a range of about −6000 volts (V) to about −600 V. In one embodiment, the negative voltage is in a range from about −3000 V to about −600 V. The method for applying the negative voltage to the carbon nanotube film 160 is not limited. For example, the power supply 140 is directly electrically connected to carbon nanotube film 160 by the conductive wires 150. The power supply 140 is directly electrically connected to the conductor 120 by the conductive wires 150. Thus the negative voltage is also applied to the carbon nanotube film 160 by the conductor 120. The power supply 140 is directly electrically connected to the conductive support structure 110 by the conductive wires 150. Thus the negative voltage is also applied to the carbon nanotube film 160 by the conductive support structure 110 and the conductor 120. One terminal of the power supply 140 is electrically connected to the carbon nanotube film 160, and another terminal of the power supply 140 is grounded or electrically connected to the metal shell surrounding the chamber 100 by the conductive wires 150. The material of the conductive wires 150 has been previously described in detail and not be described here.

Figure 13:
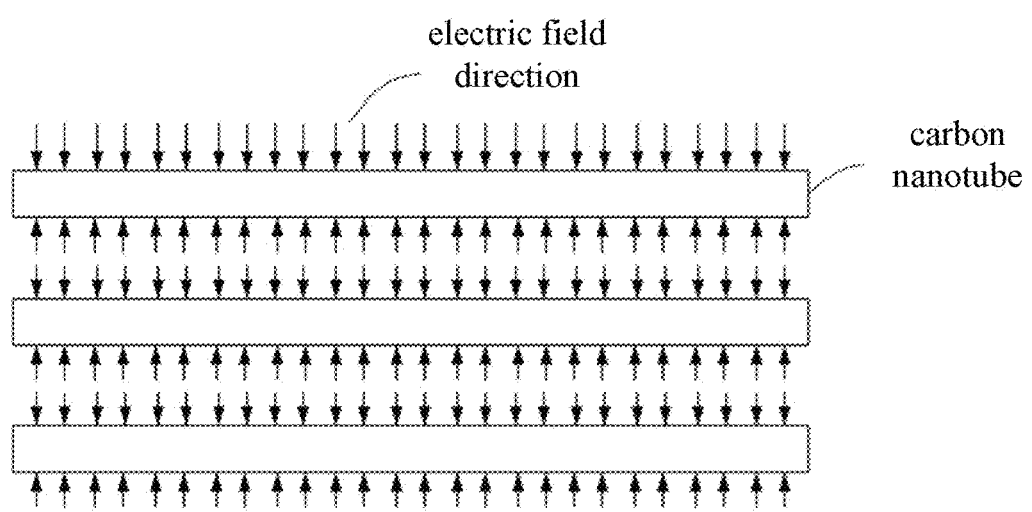
FIG. 13 is a schematic view of electric field direction of the carbon nanotube film.

After applying the negative voltage to the carbon nanotube film 160, an electric field is formed on each carbon nanotube 56 of the carbon nanotube film 160. The direction of the electric field points to each carbon nanotube 56, and is perpendicular to the axial or extending direction of each carbon nanotube 56, as shown in FIG. 13.

In the step S3, forming the carbon fiber film 50 includes the following steps:
(S31), supplying the carrier gas to the chamber 100;
(S32), supplying the carbon source gas to the chamber 100; and
(S33), heating the chamber 100 to the temperature from about 800 degrees Celsius to about 1100 degrees Celsius, cracking the carbon source gas to form many carbon free radicals, graphitizing the carbon free radicals because the carbon nanotube film 160 is negatively charged, to epitaxially form graphite layers 52 on each carbon nanotube 56 of the carbon nanotube film 160, wherein the graphite layers 52 and the carbon nanotube film 160 form the carbon fiber film 50.

In step (S31), the chamber 100 can be purified by the carrier gas. The carrier gas includes nitrogen, ammonia, or inert gas, such as argon. A flow speed of the carrier gas can range from about 50 sccm to about 100 sccm.

In step (S32), the carbon source gas can be a hydrocarbon compound, such as alkyne. A flow speed of the carrier gas can range from about 20 sccm to about 100 sccm.

In step (S33), the heater 130 surrounds the chamber 100 and heats the chamber 100 to the temperature from about 800 degrees Celsius to about 1100 degrees Celsius. The carbon source gas is continuously supplied to the chamber 100 and is cracked to form carbon free radicals. The carbon free radicals are graphitized to form the graphite sheets 58, because the carbon nanotube film 160 is negatively charged. The direction of the electric field vertically points to the axial of each carbon nanotube 56. The graphite sheets 58 need the lowest energy along the direction of the electric field. The graphite sheets 58 need to exist in the state of lowest energy according to the principle of least action. Thus, the length direction of each graphite sheet 58 is perpendicular to the axial direction of each carbon nanotube 56, as shown in FIGS. 1 and 2. An angle is defined between the thickness direction of each graphite sheet 58 and the axial direction of each carbon nanotube 56. The angle is greater than or equal to 0 degrees, and less than or equal to 90 degrees. In one embodiment, the thickness direction of each graphite sheet 58 is parallel to the axial direction of each carbon nanotube 56.

Many graphite sheets 58 forms the graphite layer 52. The thickness of the graphite layer 52 is related to the time of growing the graphite layer 52. The longer the time of growing the graphite layer 52, the thicker the thickness of the graphite layer 52, and the longer the length of the graphite sheet 58. The time of growing the graphite layer 52 ranges from about 30 minters to about 60 minters. The time of growing the graphite layer 52 can be 30 minters, 35 minters, 40 minters, 45 minters, 50 minters, 55 minters, or 60 minters. A thickness of the graphite layer 52 ranges from about 2 nanometers to about 200 nanometers. In order to uniformly cover the carbon nanotube film 160 and enclose each carbon nanotube 56, the thickness of the graphite layer 52 is greater than or equal to 2 nanometers. The thickness of a composite structure including the graphite layer 52 and the carbon nanotube film 20 is greater than or equal to 12 nanometers.

In the process of forming the graphite layer 52, the chamber 100 can be in an atmospheric or low-pressure state. The low pressure in the chamber 100 can be in a range from about 50 Pa to about 1000 Pa. The carbon nanotube film 160 cannot be destroyed at the temperature of the chamber 100, because the inert gas is in the chamber 100 and the pressure in the chamber 100 ranges from about 50 Pa to about 1000 Pa. In one embodiment, there is atmospheric pressure in the chamber 100. The pressure is proportional to the voltage, the lower the pressure, the smaller the voltage. Thus, when there is atmospheric pressure in the chamber 100, the smaller negative voltage is required during the preparation of the carbon fiber film 50.

The carrier gas and the carbon source gas can be simultaneously supplied to the chamber 100. At this time, the flow speed of the carrier gas ranges from about 10 sccm to about 50 sccm. In one embodiment, the carrier gas and the carbon source gas are simultaneously supplied to the chamber 100, the flow speed of the carrier gas is 25 sccm, and the flow speed of the carbon source gas is 50 sccm.

The carbon nanotube film 160 defines a plurality of micropores, which is formed by two adjacent carbon nanotubes 56. The graphite layers 52 are epitaxially formed on the surface of each carbon nanotube 56 and in the plurality of micropores. The graphite layers 52 thus encloses each carbon nanotubes 56.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may include some indication in reference to certain steps. However, the indication used is only to be viewed for identification purposes and not as a suggestion as to an order for the steps.

What is claimed is:

1. A method for making a carbon fiber film, the method comprising:
    suspending two graphite rods spaced apart from each other in a chamber;
    placing a carbon nanotube film comprising a plurality of carbon nanotubes on the two graphite rods, wherein the carbon nanotube film comprises a first surface and a second surface opposite to the first surface, and extending directions of the plurality of carbon nanotubes are parallel to the first surface;
    applying a negative voltage to the carbon nanotube film by applying the negative voltage to the two graphite rods, wherein the two graphite rods are in direct contact with the first surface of the carbon nanotube film, and the carbon nanotube film is suspended on the two graphite rods; and
    supplying a carbon source gas into the chamber, wherein the carbon source gas is heated and cracked to form carbon free radicals, and the carbon free radicals are graphitized to form a graphite layer on the carbon nanotube film.

2. The method of claim 1, wherein the carbon nanotube film is located on a support base comprising a support structure and the two graphite rods fixed to the support structure.

3. The method of claim 2, wherein the support structure defines a hole, one end of each of the two graphite rods is inserted into the hole so that a part of each of the two graphite rods is suspended in the chamber.

4. The method of claim 2, wherein the two graphite rods are parallel to each other.

5. The method of claim 2, wherein the support structure is a cylindrical quartz structure.

6. The method of claim 5, wherein the cylindrical quartz structure has a bottom surface perpendicular to an extending direction of the graphite rod, and the bottom surface defines a hole.

7. The method of claim 1, wherein the chamber is heated to a temperature of about 800 degrees Celsius to about 1100 degrees Celsius.

8. The method of claim 1, wherein the plurality of carbon nanotubes are joined end-to-end by van der Waals attractive force and extend along a same direction.

9. The method of claim 1, wherein the negative voltage is applied to the carbon nanotube film by a power supply.

10. The method of claim 9, wherein one terminal of the power supply is electrically connected to the carbon nanotube film, and another terminal of the power supply is grounded.

11. The method of claim 1, wherein the negative voltage is in a range from about −6000 V to about −600 V.

12. The method of claim 1, wherein the negative voltage is in a range from about −3000 V to about −600 V.

13. The method of claim 1, wherein a power supply is electrically connected to the two graphite rods by a conductive wire to apply the negative voltage.

14. The method of claim 13, wherein the conductive wire comprises a plurality of carbon nanotube wires substantially parallel with each other or twisted with each other.

15. The method of claim 1, wherein an electric field is formed on each of the plurality of carbon nanotubes when the negative voltage is applied to the carbon nanotube film, an direction of the electric field points to each of the plurality of carbon nanotubes, and the direction of the electric field is perpendicular to extending directions of the plurality of carbon nanotubes.

16. The method of claim 1, wherein the applying the negative voltage to the carbon nanotube film is performed all the time during forming the graphite layer on the carbon nanotube film.

17. A method for making a carbon fiber film, the method comprising:
    placing a support base in a chamber, wherein the support base comprises a conductive support structure and a conductor fixed to the support structure, the conductor comprises a first conductor and a second conductor spaced from each other, and each of the first conductor and the second conductor is a graphite rod;
    placing a carbon nanotube film on the first conductor and the second conductor, so that suspending the carbon nanotube film in the chamber; the carbon nanotube film comprises a plurality of carbon nanotubes; the carbon nanotube film comprises a first surface and a second surface opposite to the first surface, and extending directions of the plurality of carbon nanotubes are substantially parallel to the first surface; and the conductor is in direct contact with the first surface of the carbon nanotube film;
    applying a negative voltage to the carbon nanotube film by applying the negative voltage to the conductive support structure; and
    supplying a carbon source gas into the chamber, wherein the carbon source gas is heated and cracked to form carbon free radicals, and the carbon free radicals are graphitized to form a graphite layer on the carbon nanotube film.

18. The method of claim 17, wherein the conductive support structure is located in a non-reaction region of the chamber.

19. A method for making a carbon fiber film, the method comprising:
    placing a support structure and two graphite rods spaced apart from each other in a chamber, wherein the two graphite rods are inserted into the support structure;
    placing a carbon nanotube film on the two graphite rods, so that suspending the carbon nanotube film in the chamber; wherein the carbon nanotube film comprises a plurality of carbon nanotubes; the carbon nanotube film comprises a first surface and a second surface opposite to the first surface, and extending directions of the plurality of carbon nanotubes are substantially parallel to the first surface; and the two graphite rods are in direct contact with the first surface of the carbon nanotube film;

providing a power supply, wherein one terminal of the power supply is electrically connected to the two graphite rods by a conductive wire, and another terminal of the power supply is electrically connected to a metal shell surrounding the chamber by another conductive wire, so that the negative voltage is applied to the carbon nanotube film; and supplying a carbon source gas into the chamber, wherein the carbon source gas is heated and cracked to form carbon free radicals, and the carbon free radicals are graphitized to form a graphite layer on the carbon nanotube film.

* * * * *